United States Patent

[11] 3,622,810

[72] Inventor Sadao Sasaki
Yokohama-shi, Japan

[21] Appl. No. 791,838
[22] Filed Dec. 5, 1968
[45] Patented Nov. 23, 1971
[73] Assignee Tokyo Shibaura Electric Co. Ltd.
Kawasaki-shi, Japan
[32] Priority Dec. 8, 1967
[33] Japan
[31] 42/78396

[54] CURRENT SWITCHING TYPE FLIP-FLOP CIRCUIT DEVICE
16 Claims, 5 Drawing Figs.

[52] U.S. Cl. .......... 307/291, 307/247, 307/292, 328/206
[51] Int. Cl. .......... H03k 3/26
[50] Field of Search .......... 307/291, 292, 247; 328/206

[56] References Cited

UNITED STATES PATENTS

| | | | |
|---|---|---|---|
| 3,317,750 | 5/1967 | Narud .......... | 307/291 |
| 3,424,928 | 1/1969 | Priel .......... | 307/291 |
| 3,440,449 | 4/1969 | Priel .......... | 307/291 |
| 3,444,395 | 5/1969 | Foster .......... | 307/291 |

*Primary Examiner*—Stanley D. Miller, Jr.
*Assistant Examiner*—David M. Carter
*Attorney*—Flynn & Frishauf

ABSTRACT: A current-switching-type flip-flop circuit device including first and second sections each comprising a first current-switching-type logic circuit comprising a first transistor forming an AND input gate and a second transistor carrying out a current switching operation jointly therewith, a second current-switching-type logic circuit provided with a third transistor forming an OR input gate to perform a flip-flop action, and a means for jointly connecting the collectors of the aforementioned second and third transistors.

PATENTED NOV 23 1971 3,622,810

INVENTOR.
SADAO SASAKI,

BY
Flynn & Frishauf
Attys

INVENTOR.

BY

CURRENT SWITCHING TYPE FLIP-FLOP CIRCUIT DEVICE

BACKGROUND OF THE INVENTION

The present invention relates to a logic circuit for use in an electronic digital computer and more particularly AND-input a current-switching type flip-flop circuit provided with an AND-input gate capable of performing a quick action adapted for the operation of a semiconductor integrated circuit.

Heretofore, a current-switching-type flip-flop circuit has generally been prepared by connecting an AND gate circuit to the set and reset signal input terminals respectively of a flip-flop circuit element composed of two current switching type logic circuits. However, the conventional current-switching-type flip-flop circuit was fabricated by separately arranging the AND-input gate and the OR input gate of the flip-flop circuit element. Accordingly, where signals were to be set, for example, it was necessary to use a total of three gates including an AND-input gate and two gates required for the two current-switching-type logic circuits of a flip-flop circuit element. Therefore the prior flip-flop circuit had the drawbacks that it was of complicated arrangement and operated at a relatively slow speed.

SUMMARY OF THE INVENTION

The primary object of the present invention is to reduce the number of gates thereby to provide a current switching type flip-flop circuit capable of operating at a high speed.

Another object of the invention is to reduce the number of circuit elements thereby to provide a current-switching-type flip-flop circuit of simple arrangement.

According to the present invention, the collector of an OR input gate transistor of a flip-flop circuit element is connected with that of an AND-input gate transistor so as to arrange the AND and OR-input gates in one body, thus reducing the required number of gates to only two.

BRIEF DESCRIPTION OF THE DRAWINGS

There will now be described the present invention by reference to the appended drawings. FIG. 1 represents a first embodiment of the present invention. In this figure the AND-input gate on the set side consists of a first current-switching-type logic circuit comprising transistors 1 and 2, a transistor 3 performing a current switching action jointly therewith and resistors 4 and 5. The OR-input gate on the set side consists of a third current-switching-type logic circuit comprising transistors 6 and 7, a transistor 8 performing a current-switching-action jointly therewith and the aforesaid resistor 5 and resistor 9. Parallel to said resistor 5 is connected a diode 10. To obtain the low-voltage L of a NOT-output $\overline{Q}$, however, said diode 10 is intended to limit an input voltage supplied to a means for issuing outputs from an emitter follower consisting of a transistor 11 and resistor 12. The diode 10 is formed of NPN-type transistors whose base and collector are connected in common.

Figure 1:
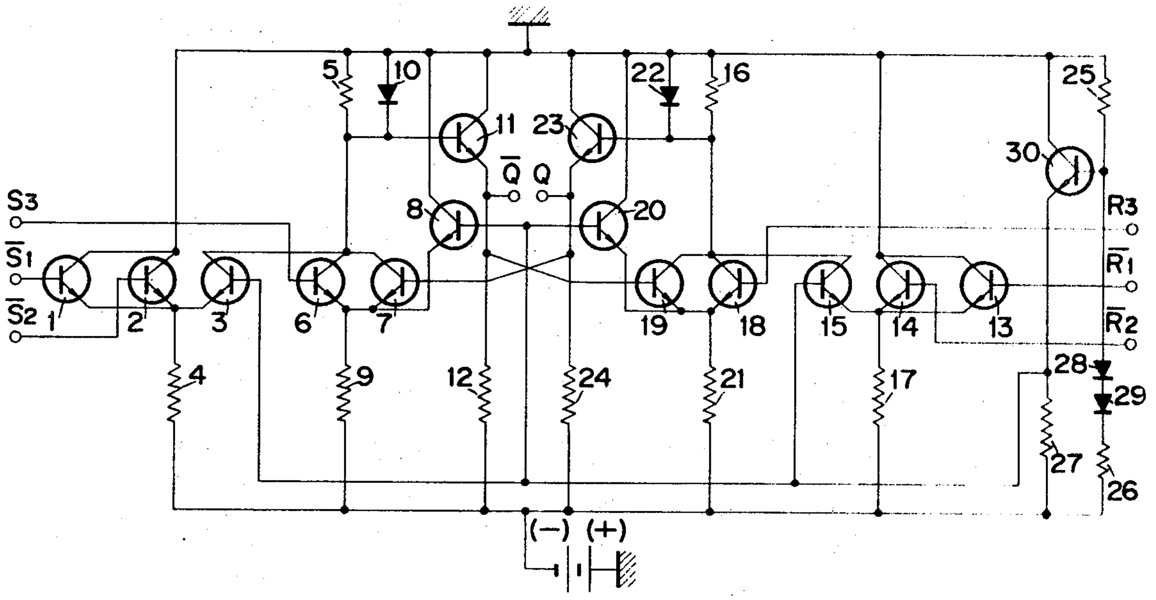
FIG. 1 is a diagram of a current-switching type flip-flop circuit provided with an AND-input gate according to an embodiment of the present invention.

The arrangement on the reset side is the same as described above. The AND-input gate consists of a second current-switching-type logic circuit comprising transistors 13, 14 and 15 and resistors 16 and 17. And the OR-input gate is composed of a fourth current-switching-type logic circuit comprising transistors 18, 19 and 20, the aforesaid resistor 16 and resistor 21. An output Q is obtained by a means for issuing outputs from an emitter follower consisting of a diode 22, transistor 23 and resistor 24. Thus a flip-flop circuit element is formed by said third and fourth current-switching-type logic circuits and a means for deriving outputs therefrom. The output Q is supplied to the base of the transistor 7 and the NOT-output $\overline{Q}$ to the base region of the transistor 19.

A bias circuit is formed of resistors 25, 26 and 27, diodes 28 and 29, and a transistor 30 and supplies a threshold voltage to the bases of the transistors 3, 15, 8 and 20.

There will now be described by reference to FIG. 1 the operation of a current-switching-type flip-flop circuit provided with an AND-input gate. First let us assume a reset condition where the equations $\overline{S_3}=\overline{R_3}=L$ (low voltage), $S_1=R_1=H$ (high voltage), $Q=L$ and $\overline{Q}=H$ are established. In this case, the current is routed through the following circuits:

a. ground (hereinafter abbreviated as "GND")→transistor 1→resistor 4→source, b. GND→transistor 8→resistor 9→source, c. GND→resistor 16→transistor 19→resistor 21→source, d. GND→transistor 13→resistor 17→source Next when signals are set by arrangement of $\overline{S_1}=\overline{S_2}=L$, then the group (a) of the above-mentioned current routes will be changed to:

a'. GND→resistor 5→transistor 3→resistor 4→source and the NOT-output $\overline{Q}$ will be reduced to $L$ due to the occurrence of a voltage drop at the resistor 5 to turn off the transistor 19. Accordingly the group (c) of the aforesaid current routes will be changed to:

c'. GND→transistor 20→resistor 21→source to obtain an output $Q$ of the $H$ voltage. Since the transistor 7 is turned on, the group (b) of said current routes will be changed to:

b'. GED→resistor 5→transistor 7→resistor 9→source.

At this time the current travelling through resistor 5 amounts to a sum of the currents carried through both groups (a)' and (c)'. Therefore it is necessary that the amplitude of the signal issued from the resistor 5 is clamped by the diode 10, so that said amplitude does not exceed a prescribed value. Later when $\overline{S}_1$ is raised to H, the current route will only change from (a)' back to (a), with the set condition still maintained by the current route (b)'.

The resetting operation may be considered to follow the same process as described above. The gate operations, which are continued until there are made outputs response according to the aforementioned process, are divided into those of the first gate consisting of transistors 1, 2 and 3 and resistors 4 and 5 and those of the second gate comprising transistors 18, 19 and 20 and resistors 16 and 21. In this case the first gate concurrently acts as an AND-input gate and OR-input gate.

Thus the flip-flop circuit of FIG. 1 according to an embodiment of the present invention enables outputs to be obtained by two gates, although the conventional flip-flop circuit required three gates in obtaining outputs. Accordingly, the time of delay in responding outputs is reduced by that length of time which would otherwise be consumed in allowing outputs to pass through an extra gate.

Figure 2:
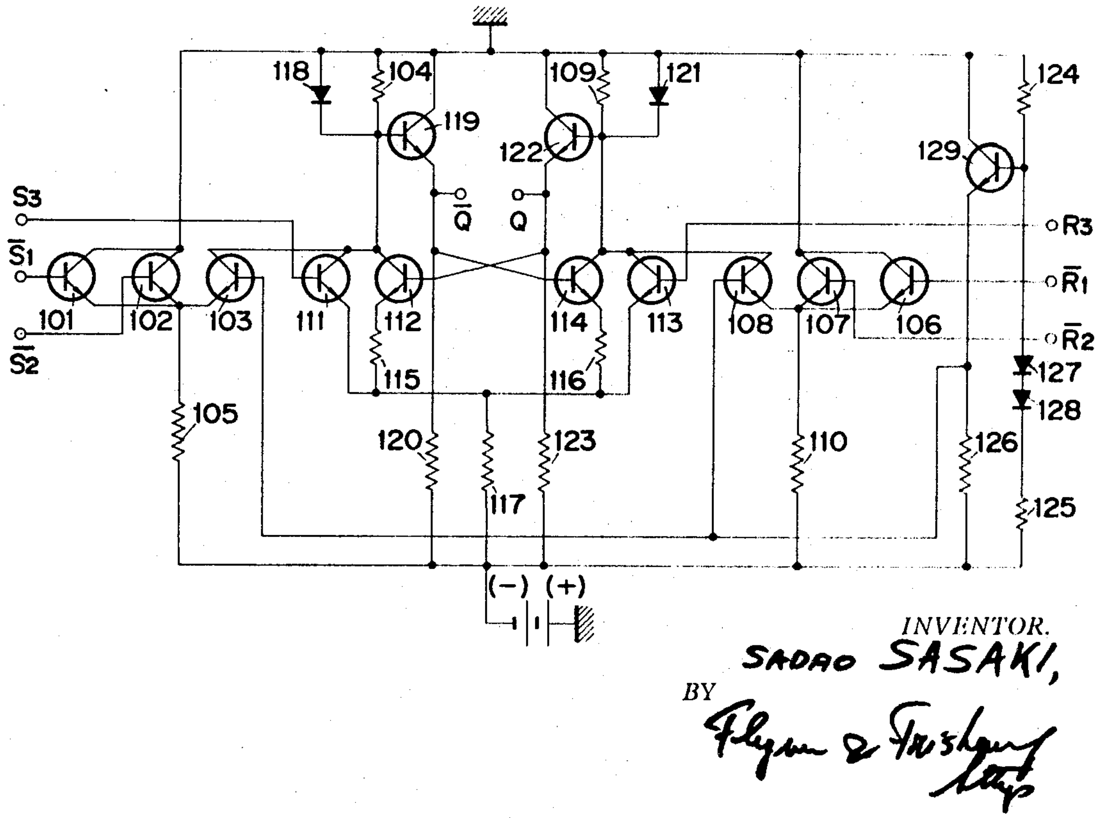
FIG. 2 is a circuit diagram according to another embodiment of the invention.

There will now be described a current-switching-type flip-flop circuit of FIG. 2 provided with an AND-input gate according to another embodiment of the present invention.

The AND-input gate on the set side consists of a first current-switching-type logic circuit comprising transistors 101, 102 and 103 and resistors 104 and 105. And the AND-input gate on the reset side is composed of a second current-switching-type logic circuit comprising transistors 106, 107 and 108 and resistors 109 and 110.

The OR-input gates and the output-delivering means consist of a third current-switching-type logic circuit comprising transistors 111 and 112, 113, 114, 119 and 122 resistors 115, 116, 117, 120 and 123 and the aforementioned resistor 104 and 109. A NOT-output $\overline{Q}$ is obtained by connecting the aforesaid resistor 104 and diode 118 in parallel, using a means for issuing output from an emitter follower formed of a transistor 119 and resistor 20. And an output Q is obtained by connecting the aforementioned resistor 109 and diode 121 in parallel, using a means for issuing outputs from an emitter follower composed of a transistor 122 and resistor 123. Thus arranged is the flip-flop circuit element which performs a flip-flop action by the third current-switching-type logic circuits including the output-delivering means. The output Q is supplied to the base of the transistor 112 and the NOT-output $\overline{Q}$ to that of the transistor 114.

A bias circuit is composed of resistors 124, 125 and 126, diodes 127 and 128 and a transistor 129 and supplies threshold voltage to the bases of the transistors 103 and 108.

There will now be described the operation of this flip-flop circuit. First let us assume a reset condition where the equations $S_3=R_3=L$, $\overline{S}_1=\overline{R}_1=H$, Q=L and $\overline{Q}$=H are established. In this case the current will be routed through the following circuits:

e. GND→transistor 101→resistor 105→source, f. GND→resistor 109→transistor 114→resistor 116→resistor 117→source, and g. GND→transistor 106→resistor 110→source.

If, at this moment, signals set as $S_1=S_2=L$ are introduced, then the group (e) of the aforementioned current routes will be changed to:

e'. GND→resistor 104→transistor 103→resistor 105→source. Thus the NOT-output $\overline{Q}$ is reduce to L due to the voltage drop caused by the resistor 104. Accordingly, the transistor 114 is turned off with the resultant reduction in the voltage drop caused by the resistor 109, until the output Q is raised to H. Then the group (f) of the aforesaid current routes will be changed to:

f'. GND→resistor 104→transistor 112→resistor 115→resistor 117→source. When $\overline{S}_1$ is raised to H, the aforesaid current route (e)' will be brought back to the current route (e), but the route (f)' will not be altered, so that the set condition will be maintained. (This holds true with the reset operation.) The flip-flop circuit of FIG. 2 uses two gates as in that of FIG. 1 until there is obtained an output. Namely, an output on the set side is obtained jointly by a first gate consisting of transistors 101, 102 and 103 and resistors 104 and 105 and a second gate comprising transistors 111, 112, 113 and 114 and resistors 104, 109, 115, 116 and 117.

Figure 3:
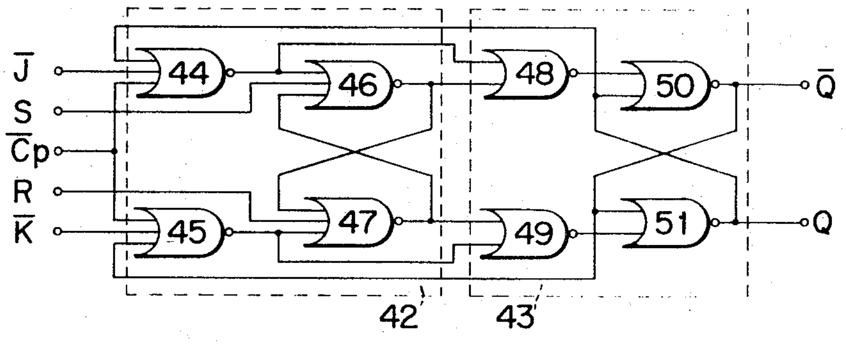
FIG. 3 is a block diagram of a master-slave-type J·K flip-flop circuit using a current-switching-type flip-flop circuit provided with an AND-input gate according to the invention.

There will now be described the case of preparing a master-slave-type J·K flip-flop circuit, as shown in FIG. 3, using a current-switching-type flip-flop circuit of the present invention provided with an AND-input gate. As is well known, the master-slave-type flip-flop circuit is arranged in such a manner that the master flip-flop circuit is so formed as to take the place of a means for storing the immediately preceding condition and the slave flip-flop circuit is actuated by the directions of the master circuit. Referring now to FIG. 3, numerals 42 and 43 are current-switching-type flip-flop circuits provided with an AND-input gate. The numeral 42 represents a master section which is operationally composed of NAND-circuits 44 and 45 and NOR-circuits 46 and 47. The numeral 43 denotes a slave section which operationally consists of NAND-circuits 48 and 49 and NOR-circuits 50 and 51.

Figure 4:
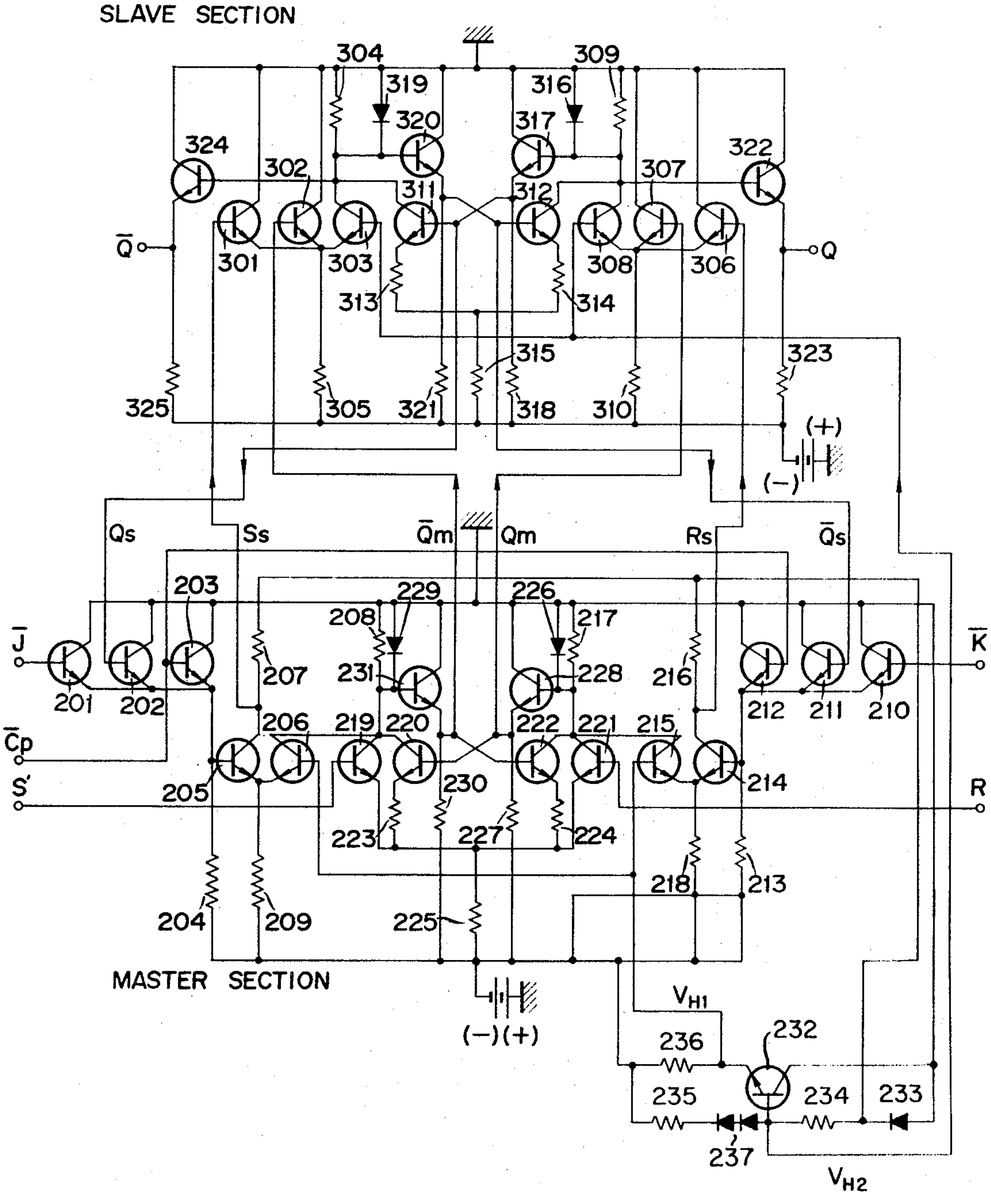
FIG. 4 represents the master-slave-type J·K flip-flop circuit of FIG. 3.

According to FIG. 4 there will now be described an embodiment of the master-salve-type flip-flop circuit of the present invention provided with an AND-input gate. The master and slave sections constitute a J·K flip-flop circuit. The AND-input gate on the set side of the master section consists of transistors 201, 202 and 203 and a resistor 204. The base of the transistor 201 is supplied with an input $\overline{J}$, that of the transistor 202 with an output Qs from the slave section and that of the transistor 203 with a clock pulse $\overline{Cp}$. This AND operation is transmitted to a circuit comprising transistors 205 and 206 and resistors 207, 208 and 209. The transistor 206 performs a current-switching operation with the AND-input gate composed of the transistors 201, 202, 203 and 205. Namely, a first current-switching-type logic circuit is formed of the transistors 201, 202, 203, 205 and 206 and resistors 204, 207, 208 and 209.

The AND-input gate on the reset side is similarly arranged. The AND-input gate comprises transistors 210, 211 and 212 and a resistor 213. This AND operation is transmitted to a circuit consisting of transistors 214 and 215 and resistors 216, 217 and 218. Namely, a second current-switching-type logic circuit is composed of transistors 210, 211, 212, 214 and 215 and resistors 213, 216, 217 and 218. The base of the transistor 210 is supplied with an input $\overline{K}$, that of the transistor 211 with a NOT-output $\overline{Qs}$ from the slave section, and that of the transistor 212 with a clock pulse $\overline{Cp}$. The transistors 219, 220, 221, 222, 228 and 231 and resistors 208, 223, 225, 217, 224, 230 and 227 constitute a third current-switching-type logic circuit. An output Qm is obtained by a means for issuing outputs from and emitter follower consisting of a diode 226, resistor 227 and transistor 228. And a NOT-output $\overline{Qm}$ is supplied by means for issuing outputs from an emitter follower comprising a diode 229, resistor 230 and transistor 231. The output Qm is transmitted to the base of the transistor 220 and the NOT-output $\overline{Qm}$ to that of the transistor 222. Further, the bases of the transistors 219 and 221 paired with the aforementioned transistors 220 and 222 are supplied with a set input S and reset input R respectively. These set input S and reset input R are intended separately to set and reset a flip-flop circuit element composed of the third and fourth current-switching-type logic circuits including output-delivering means.

A bias circuit is formed of a transistor 232, diode 233 and resistors 234, 235 and 236, and supplies a threshold voltage $V_{TH1}$ to the bases of the transistors 206 and 215. This threshold voltage $V_{TH1}$ constitutes a reference voltage for the current switching operation. For instance, when the input $\overline{J}$ is elevated to a high-voltage H, the transistor 201 is turned on and the voltage of the base of the transistor 205 is elevated, causing said transistor 205 to be conducted. At this time, the threshold voltage $V_{TH1}$ is so set as to turn off the transistor 206. Further when the inputs $\overline{J}$, Qs and $\overline{Cp}$ are all reduced to a low-voltage L, then the voltage of the base of the transistor 205 is lowered, causing said transistor 205 to be turned off. Also at this time the threshold voltage $V_{TH1}$ is so set as to cause the transistor 206 to be turned on.

The diode 233 of the bias circuit supplies the collectors of the transistors 205 and 214 with a voltage which is lower by a voltage $V_{BE}$ across the base and emitter of transistor 232 than the ground voltage through the resistors 207 and 216 respectively.

To actuate the second, namely, slave section of the flip-flop circuit, there are obtained from the collector of the transistors 205 and 214 the set input signal Ss and reset input signal Rs to be supplied to said slave section in addition to the true output Qm and NOT-output $\overline{Qm}$. If H represents a truth value, the logic formulas of the set input signal Ss and reset input signal Rs will respectively be $Ss=J\cdot\overline{Qs}\cdot Cp$ and $Rs=K\cdot Qs\cdot Cp$. This slave section is of substantially the same arrangement as the master section. Namely, the AND input gate on the set side comprises a first current-switching-type logic circuit comprising transistors 301, 302 and 303 and resistors 304 and 305. An AND input gate is constituted of transistors 301 and 302. The set input signal Ss from the master section is supplied to the base of the transistor 301 and the NOT-output $\overline{Qm}$ to that of the transistor 302.

The AND input gate on the reset side is formed of a second current-switching-type logic circuit comprising transistors 306, 307 and 308 and resistors 309 and 310. The AND input gate is constituted of transistors 306 and 307. The reset input signal Rs from the master section is supplied to the base of the transistor 306 and an output Qm to that of the transistor 307. A third current-switching-type logic circuit is composed of the resistors 430, 309, 315, 318 and 321 and transistors 311, 312, 317 and 320. An output Qs is obtained by connecting the resistor 309 and limiting diode 316 in parallel, using a means for issuing outputs from an emitter follower composed of a transistor 317 and resistor 318, and is supplied to the base of the transistor 311 and master section. A NOT-output $\overline{Qs}$ is obtained by connecting the resistor 304 and limiting diode 319 in parallel, using a means for issuing outputs from an emitter follower consisting of a transistor 320 and resistor 321, and is supplied to the base of the transistor 312 and master section. The third current-switching-type logic circuits including output-delivering means constitute the flip-flop circuit elements of the slave section. An emitter follower comprising a transistor 322 and resistor 323 and concurrently acting as a level-shifting means produces an output Q from the master-slave-type J·K flip-flop circuit, said output being the same as an output Qs from the slave section. A NOT output $\overline{Q}$ is obtained by en emitter follower composed of a transistor 324 and resistor 325. It will be apparent that the outputs Qs and $\overline{Qs}$ can be changed to Q and $\overline{Q}$ respectively by omission of the two eliminators. A threshold voltage $V_{TH2}$ from the master section is supplied to the bases of the transistors 303 and 308 which act as an AND input gate and carries out the switching of currents.

Figure 5:
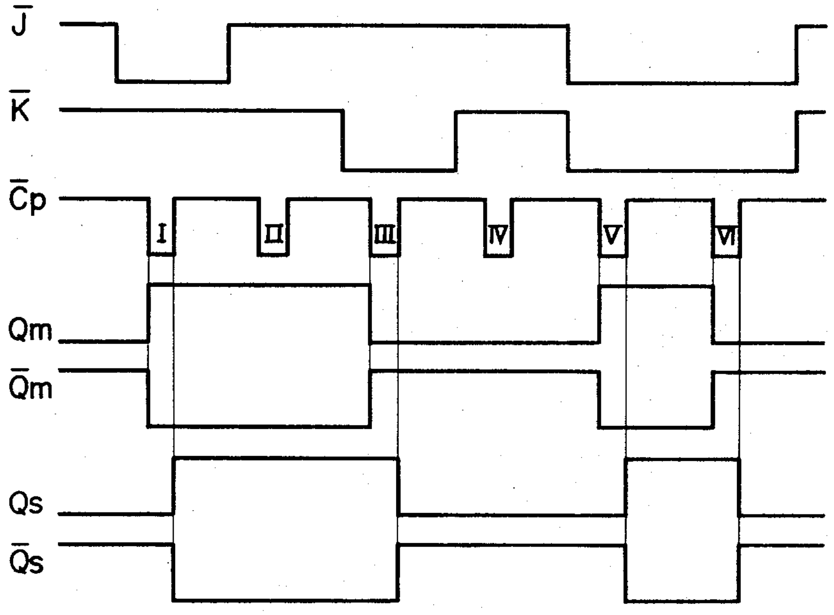
FIG. 5 is a waveform diagram illustrative of the function of said master-slave-type J·K flip-flop circuit.

There will now be described the operation of the master-slave-type J·K flip-flop circuits of FIG. 4 by reference to FIG. 5. To begin with, when the signals $\overline{J}$, $\overline{K}$ and $\overline{Cp}$ all have a voltage H, the transistors 205 and 214 are turned on, causing the transistors 206 and 215 to be turned off. Now let it be assumed that the third current-switching-type logic circuit is conducted through the resistor 309 and the transistor 222, and resistors 224 and 225. In this case, the slave section is conducted through the transistors 302 and 308, and the third current-switching-type logic circuit is turned on through the resistor 309, transistor 312 and resistors 314 and 315. If, at this time, $\overline{J}$ is reduced to a low-voltage L, the transistor 201 will be turned off. However, since $\overline{Cp}$ still retains a high-voltage H, the transistor 205 remains conducted.

Referring now to FIG. 6, when the clock pulse $\overline{Cp}$ is brought to the position of I the signals $\overline{J}$, $\overline{Qs}$ and $\overline{Cp}$ are all reduced to a low-voltage L. Accordingly, the transistor 205 is turned off and the current flowing therethrough is switched to a course through the transistor 206. Due to the voltage drop caused by the resistor 208, therefore, $\overline{Qm}$ will be changed to a low-voltage L with the resultant turn off of the transistor 222, so that the current running therethrough will be routed through the transistor 220. At this time the current travelling through the resistor 208 will amount to a sum of the currents carried through the transistors 206 and 220, so that the diode 229 is used to restrict the voltage of the base of the transistor 231. In this case the transistors 301 and 307 of the slave section are turned on. However, since the transistor 312 still remains conducted the condition of said slave section does not change. If, at this time, $\overline{Cp}$ is brought back to a high-voltage H, then the transistor 205 of the master section is turned on, causing the current flowing through the transistor 206 to pass again through said transistor 205. However, since the transistor 220 remains conducted, the voltage of the output Qm and NOT-output $\overline{Qm}$ does not change to the opposite level. However, when the transistor 205 is turned on the set input signal Ss 10th will be reduced to a low-voltage L and the flow of currents through the transistor 301 of the slave section will be changed to the transistor 303. Due to a voltage drop at the resistor 304, therefore, the NOT-output $\overline{Qs}$ is reduced to a low-voltage L and the current passing through the transistor 312 gradually decreases until the output Qs is moved up to a high-voltage H with the resultant turn on of the transistor 311. Thus the contents of the master section are transmitted to the slave section by the clock pulse. If, at this time, $\overline{J}$ is raised to a high-voltage H, the master and slave sections will suffer no effect, because the transistor 205 is already conducted.

Next when the clock pulse $\overline{Cp}$ is brought to the position to II, the transistors 203 and 212 are turned off. However, since the transistors 205 and 214 are already turned on, the conditions of the master and slave sections do not change.

Where the clock pulse $\overline{Cp}$ is brought to III and IV a resetting operation is conducted in an exactly opposite way to the setting process, and description thereof is omitted.

In the case the clock pulse comes to V, the output Qs and NOT-output $\overline{Qs}$ are changed to L and H respectively. Accordingly, the master section is set in the same way as when the clock pulse stands at the position of I and then the slave section is also set by the directions of the master section. Thus the master section is set by the clock pulse and when the clock pulse is emptied from the master section the slave section is set. Accordingly, there is no possibility of both master and slave sections being set at the same time.

When the clock pulse $\overline{Cp}$ is brought to the position of VI, the outputs Qs and NOT-output $\overline{Qs}$ are changed to the H and L respectively. This time the master section is set in the same way when the clock pulse $\overline{Cp}$ comes to III and thereafter the slave section is also set.

With the J·K flip-flop circuit, even when a trigger pulse is conducted to both J and K input terminals at the same time, the contents of the flip-flop circuit can be inversely transferred, because the immediately preceding state still remains stored.

There will now be briefly described modifications of the aforementioned embodiment. It is also possible to attacn the amplifier of an input emitter follower to the first and second AND input gates of the flip-flop circuits of FIGS. 1 and 2 in the same manner, for example, as in the master section of the master-slave-type flip-flop circuit of FIG. 4. The master and slave sections of the J·K flip-flop circuit may be respectively composed of any one of four circuits, that is, circuits shown in FIGS. 1 and 2 and circuits having an input emitter follower amplifier attached to the same types as those of FIGS. 1 and 2.

It will be apparent that the bias circuit may consist of any other suitable type than described.

If all the transistors used in the aforementioned circuits are made of an NPN-type, and the diodes for clamping consist of NPN-type transistors, then there will be obtained advantage in making a flip-flop circuit into an integrated type, because a substrate of an NPN-type transistor is formed of silicon.

As mentioned above, the present invention provides a current-switching-type flip-flop circuit provided with an AND input gate which, as compared with the conventional circuit device, can accomplish quick outputs response due to the use of gates one unit less and requires a fewer circuit elements, so that it is well adapted for use in an electronic digital computer whose high-speed operation is increasingly demanded and whose circuit tends to be more integrated.

I claim:

1. A current-switching-type flip-flop circuit comprising:

a power source supplying a DC voltage;

a first current-switching logic circuit comprising a first group of transistors forming an AND input gate and a second transistor for carrying out a current-switching operation jointly with said first group of transistors;

a second current-switching logic circuit comprising a third group of transistors forming an AND input gate and a fourth transistor for carrying out a current-switching operation jointly with said third group of transistors;

a flip-flop circuit element comprising a fifth transistor forming a part of a first OR-input gate and a sixth transistor forming a part of a second OR input gate;

means for directly connecting together the collectors of said second and fifth transistors to directly interconnect the AND gate formed of said first group of transistors with said flip-flop circuit element;

means for directly connecting together the collectors of said fourth and sixth transistors to directly interconnect the AND gate formed of said third group of transistors with said flip-flop circuit element; and a bias circuit for supplying a threshold voltage to the bases of said second and fourth transistors whereby to provide a current-switching-type flip-flop circuit having a high switching speed;

said flip-flop circuit element comprising:

a third current-switching-type logic circuit including:

said fifth transistor of said first OR gate having a collector connected to a first resistor, an emitter connected to the power source through a ninth resistor;

a ninth transistor performing an OR operation with the fifth transistor and having an emitter and a collector connected in common with those of the fifth transistor and a base supplied with a direct set signal;

a 10th resistor carrying out a current-switching operation jointly with said fifth or ninth transistor and having a collector connected to ground, an emitter connected to the emitters of said fifth and ninth transistors and a base supplied with a threshold voltage from the bias circuit; and an 11th transistor connected as an emitter follower and deriving a NOT-output signal from its emitter; said 11th transistor having a collector connected to ground, an emitter connected to the power source through a 10th resistor and a base connected to the collectors of said fifth and ninth transistors and to ground through a first diode connected in parallel with a first resistor; and a fourth current-switching-type logic circuit including:

said sixth transistor of said second OR gate having a collector connected to a third resistor, an emitter connected to the power source through an eleventh resistor and a base supplied with the NOT output from the emitter of said 11th transistor;

a 12th transistor performing an OR operation with the sixth transistor and having an emitter and collector connected in common with those of the sixth transistor and a base supplied with a direct reset signal;

a 13th transistor carrying out a current-switching operation jointly with said sixth or 12th transistor and having a collector connected to ground, an emitter connected to the emitters of the sixth and 12th transistors and a base supplied with a threshold voltage from the bias circuit; and a 14th transistor connected as an emitter follower and deriving an output signal from its emitter, said 14th transistor having a collector connected to ground, an emitter-supplying outputs to the base of said fifth transistor and connected to the power source through a 12th resistor, and a base connected to the collectors of the sixth and 12th transistors and to ground through a second diode connected in parallel with a third resistor.

2. A current-switching-type flip-flop circuit according to claim 1, wherein transistors are all of NPN-type and the diodes are formed of NPN-type transistors whose base and collector are connected in common.

3. A circuit according to claim 1 wherein said bias circuit comprises:

a 15th transistor having a collector to the ground and an emitter connected to the power source through a 16th resistor, the threshold voltage being derived from between the emitter of the 15th transistor and the 16th resistor and being supplied to the base of said 10th transistor of the third current-switching logic circuit and to the base of said 13th transistor of the fourth current-switching logic circuit;

a 17th resistor connected between the collector and the base of said 15th transistor; and a third diode, the anode thereof being coupled to the base of said 15th transistor and the cathode thereof being coupled to the power source through an 18th resistor.

4. A current switching type flip-flop circuit comprising:

a power source supplying a DC voltage;

a first current-switching logic circuit comprising a first group of transistors forming an AND-input gate and a second transistor for carrying out a current-switching operation jointly with said first group of transistors;

a second current-switching logic circuit comprising a third group of transistors forming an AND-input gate and a fourth transistor for carrying out a current-switching operation jointly with said third group of transistors;

a flip-flop circuit element comprising a fifth transistor forming a part of a first OR-input gate and a sixth transistor forming a part of a second OR-input gate;

means for directly connecting together the collectors of said second and fifth transistors to directly interconnect the AND gate formed of said first group of transistors with said flip-flop circuit element;

means for directly connecting together the collectors of said fourth and sixth transistors to directly interconnect the AND gate formed of said third group of transistors with said flip-flop circuit element; and a bias circuit for supplying a threshold voltage to the bases of said second and fourth transistors thereby to provide a current-switching-type flip-flop circuit having a high-switching speed;

said flip-flop circuit element comprising:

a fifth current switching-type logic circuit including:

said fifth transistor of said first OR gate having a collector connected to ground through a first resistor, and an emitter connected to the power source through 13th and 15th resistors:

a ninth transistor performing an OR operation with the fifth transistor having a collector connected in common with that of the fifth transistor, an emitter connected to the power source through the 15th resistor in parallel with the fifth transistor and the 13th resistor, and a base supplied with the direct set signal; and an 11th transistor for deriving a NOT output signal from its emitter and having a collector connected to ground, a base connected to the collectors of fifth and ninth transistors and to ground through a first diode connected in parallel with a first resistor, and an emitter connected to the power source through a 10th resistor; and a sixth current-switching-type logic circuit including:

said sixth transistor of said second OR gate having a base supplied with the NOT output from the emitter of the 11th transistor, a collector connected to ground through a third resistor, and an emitter connected to the power source through a 14th and said 15th resistors;

a 12th transistor performing an OR operation with the sixth transistor and having a collector connected in common with that of the sixth transistor, an emitter connected to the power source through the fifteenth resistor in parallel with sixth transistor and the 14th resistor, and a base supplied with the direct reset signal; and a 14th transistor for deriving output signal from its emitter and for carrying out a current-switching operation jointly with said fifth transistor, said 14th transistor having a collector connected to ground, a base connected to the collectors of the sixth and 12th transistors and to ground through a second diode connected in parallel with a third resistor, and an emitter connected to the power source through a 12th resistor and to the base of said fifth transistor.

5. A current-switching-type flip-flop circuit according to claim 4, wherein transistors are all of NPN-type and the diodes are formed of NPN-type transistors whose base and collector are connected in common.

6. A current switching-type flip-flop circuit comprising:

a power source supplying a DC voltage;

a first current-switching logic circuit comprising a first group of transistors forming an AND-input gate and a second transistor for carrying out a current-switching operation jointly with said first group of transistors;

a second current-switching logic circuit comprising a third group of transistors forming an AND-input gate and a fourth transistor for carrying out a current-switching operation jointly with said third group of transistors;

a flip-flop circuit element comprising a fifth transistor forming a part of a first OR-input gate and OR-input sixth transistor forming a part of a second OR-input gate;

means for directly connecting together the collectors of said second and fifth transistors to directly interconnect the AND gate formed of said first group of transistors with said flip-flop circuit element;

means for directly connecting together the collectors of said fourth and sixth transistors to directly interconnect the AND gate formed of said third group of transistors with said flip-flop circuit element; and a bias circuit for supplying a threshold voltage to the bases of said second and fourth transistors thereby to provide a current-switching-type flip-flop circuit having a high switching speed;

said first group of transistors having their bases supplied with set signals and their collectors grounded;

said second transistor having its collector grounded via a first resistor, a base to which said threshold voltage is supplied from said bias circuit, and an emitter which is connected to the emitters of said first group of transistors in common and to the power source through a second resistor;

said third group of transistors having their bases supplied with reset signals and their collectors grounded; and said fourth transistor having its collector grounded through a third resistor, a base supplied with said threshold voltage from said bias circuit and an emitter which is connected to the emitters of said third group of transistors in common and to the power source through a fourth resistor; and said bias circuit comprising:

a 15th transistor having a collector connected to ground and an emitter connected to the power source through a 16th resistor, the threshold voltage being derived from between the emitter of the 15th transistor and the 16th resistor and being supplied to the bases of the second and fourth transistors;

a 17th resistor connected between the collector and the base of the 15th transistor; and a third diode, the anode thereof being coupled to the base of the 15th transistor, and the cathode thereof being coupled to the power source through a 18th resistor.

7. A current-switching-type flip-flop circuit according to claim 6, wherein transistors are all of NPN-type and the diodes are formed of NPN-type transistors whose base and collector are connected in common.

8. A current-switching-type flip-flop circuit comprising:

a power source supplying a DC voltage;

a first current-switching logic circuit comprising a first group of transistors forming an AND input gate and a second transistor for carrying out a current-switching operation jointly with said first group of transistors;

a second current-switching-logic circuit comprising a third group of transistors forming an AND input gate and a fourth transistor for carrying out a current-switching-operation jointly with said third group of transistors;

a flip-flop circuit element comprising a fifth transistor forming a part of a first OR input gate and a sixth transistor forming a part of a second OR-input gate;

means for directly connecting together the collectors of said second and fifth transistors to directly interconnect the AND gate formed of said first group of transistors with said flip-flop circuit element;

means for directly connecting together the collectors of said fourth and sixth transistors to directly interconnect the AND gate formed of said third group of transistors with said flip-flop circuit element; and a bias circuit for supplying a threshold voltage to the bases of said second and fourth transistors thereby to provide a current-switching-type flip-flop circuit having a high switching speed;

said fourth transistor having a collector connected to the ground via a third resistor, a base supplied with a threshold voltage from said bias circuit, and an emitter which is connected to the emitter of said eighth transistor in common and to the power source through a fourth resistor;

said bias circuit comprising:

a 15th transistor supplying the threshold voltage from its emitter to the bases of the second and fourth transistor and having a collector connected to ground, an emitter connected to the power source through a 16th resistor and a base connected to the power source through an 18th resistor;

a fourth diode, the anode of which is connected to said ground and the cathode of which is connected to the collectors of said seventh and eighth transistors through said fifth and seventh resistors, respectively; and a 19th resistor connected between the cathode of said fourth diode and the base of said 15th transistor.

9. A current-switching-type flip-flop circuit according to claim 8, wherein transistors are all of NPN-type and the diodes are formed of NPN-type transistors whose base and collector are connected in common.

10. A master-slave-type J K flip-flop circuit formed of an integrated circuit having current-switching-type logic circuits, said circuit (FIG. 4) including:

a master section comprising:

a power source;

a first current-switching-type logic circuit including:

a first group of transistors forming an AND-input gate including a 201 transistor whose base is supplied with input signals $\overline{J}$ and whose collector is coupled to ground, a 202 transistor whose base is supplied with an output from said slave section and whose collector is coupled to ground, and a 203 transistor whose base is supplied with clock pulses and whose collector is coupled to ground, the emitters of the transistors of said first group being connected in common and to ground through a 204 resistor and a 205 transistor whose base is connected between said common emitters of said 201–203 transistors and said 204 resistor, the emitter of said 205 transistor being connected to the power source through a 209 resistor and the collector of said 205 transistor being connected to a 207 resistor, to thereby supply set signals to said slave section; and a 206 transistor having a collector connected to ground through a 208 resistor, an emitter connected to the power source through said 209 resistor and a base supplied with a threshold voltage from the bias circuit;

a second current switching type logic circuit including:

a group of transistors forming an AND input gate including a 210 transistor whose base is supplied with input signals $\overline{K}$ and whose collector is coupled to ground, a 211 transistor whose base is supplied with NOT outputs from said slave section and whose collector is to ground, and a 212 transistor whose base is supplied with clock pulses and whose collector is coupled to ground, the emitters of said 210–212 transistors being connected in common and to the power source through a 213 resistor and a 214 transistor whose base is connected between said common emitters of said (210–212) transistors, whose emitter is connected to the power source through a 218 resistor and whose collector is connected to a 216 resistor, to thereby supply reset signals to the slave section; and a 215 transistor having a collector connected to ground through a 217 resistor, an emitter connected to the power source through a 218 resistor, and a base supplied with threshold voltage from the bias circuit;

a flip-flop circuit element including:

a 219 transistor having a collector connected to ground through a 208 resistor, and a base supplied with set signals;

a 220 transistor having a collector formed in common with that of said 206 transistor and an emitter connected to that of said 219 transistor through a 223 resistor;

a 231 transistor having a collector connected to ground, a base connected to ground through a parallel connection of a 208 resistor and a 229 diode and to the collectors of said 206, 219 and 220 transistors, and an emitter connected to ground through a 230 resistor;

a 221 transistor having a collector connected to ground through a 217 resistor and a base supplied with reset signals;

a 222 transistor having a collector formed in common with that of said 221 transistor, an emitter connected to that of said 221 transistor through a 224 resistor and a base supplied with NOT outputs from the emitter of said 231 transistor; and a 228 transistor having a collector connected to ground, a base connected to ground through a parallel connection of a 226 diode and a 217 resistor and to the collectors of said 215, 221 and 222 transistors, and an emitter connected to the power source through a 227 resistor and supplying outputs to the base of a 220 transistor, the emitters of said 219 and 221 transistors being jointly connected to ground through a 225 resistor;

means for directly connecting together the collectors of said 215 and 222 transistors to directly interconnect the AND gates of said first and second current-switching circuits to said flip-flop circuit element, whereby the outputs of the first and second current-switching-type logic circuits cause said flip-flop circuit element of said master section to operate; and a bias circuit including:

a 232 transistor having an emitter connected to the bases of said 206 and 215 transistors, a collector connected to ground and a base supplying a threshold voltage to said slave section; and a 235 resistor connected between the base of said 232 transistor and the power source:

a 236 resistor connected between the emitter of said 232 transistor and the power source; and a 234 resistor and a 233 diode connected serially between the base of said 232 transistor and ground, a conductor between said 234 resistor and said 233 diode being connected to the collectors of said 205 and 214 transistors through said 207 and 214 resistors and through said 207 and 216 resistors, respectively;

a slave section comprising:

a power source;

a first current-switching-type logic circuit including a 303 switch transistor and an AND-input gate;

a second current-switching-type logic circuit including a 308 switch transistor and an AND-input gate;

means coupling said inputs of said master section flip-flop element to drive said 303 and 308 transistors;

a flip-flop circuit element including 311 and 312 gating transistors which form parts of first and second OR gates, respectively, and having third and fourth outputs;

means for directly connecting together the collectors of said 303 and 311 transistors;

means for directly connecting together the collectors of said 308 and 312 transistors; and a bias circuit supplying a threshold voltage to said circuits and circuit elements;

whereby the outputs of said first and second current-switching-type logic circuits of said slave section cause said flip-flop element of said slave section to operate.

11. A current-switching-type flip-flop circuit according to claim 10 wherein:

e. a first current-switching-type logic circuit of said slave section comprises:

a 301 transistor having a base supplied with a set signal from the collector of said 205 transistor, a collector connected to ground;

a 302 transistor having a base supplied with NOT outputs from the emitter of said 321 transistor, and collector connected to ground; and a 303 transistor having a collector connected to ground through a 304 resistor and a base supplied with a threshold voltage from the master section, the emitters of said 301–303 transistors being jointly connected to the power source through a 305 resistor;

f. the second current-switching-type logic circuit of said slave section comprises:

a 306 transistor having a base supplied with reset signals from the collector of said 214 transistor, and a collector connected to ground;

a 307 transistor having a base supplied with outputs from the emitter of said 228 transistor and a collector connected to ground; and a 308 transistor having a base supplied with a threshold voltage from the bias circuit and a collector connected to ground through a 309 resistor, the emitters of said 306–308 transistors being jointly connected to the power source through a 310 resistor;

g. the flip-flop circuit element comprising the third current-switching-type logic circuit of said slave section includes:

a 311 transistor having a collector connected to ground through a 314 resistor;

a 320 transistor having a base connected to ground through a parallel connection of a 304 resistor and a 319 diode and to the collectors of said 303 and 311 transistors, a collector connected to ground and an emitter connected to the power source through a 321 resistor;

a 312 transistor having a collector connected to ground through a 309 resistor and a base supplied with NOT outputs from the emitter of said 320 transistor;

a 317 transistor having a collector connected to ground, a base connected to ground through a parallel connection of a 316 diode and a 309 resistor and to the collectors of said 308 and 312 transistors and the emitter connected to the power source through a 318 resistor and supplying outputs to the base of said 311 transistors and the emitters of said 311 and 312 transistors being connected to the power source through a 315 resistor; and h. the means in said slave section for deriving outputs and NOT outputs comprises:

a 324 transistor having a base connected to ground through a 304 resistor, a collector connected to ground and an emitter connected to the power source through a 325 resistor, from which NOT outputs are derived, and a 322 transistor having a base connected to ground through a 309 resistor, its collector connected to ground and an emitter connected to the power source through a 323 resistor, from which outputs are derived.

12. A current-switching-type flip-flop circuit according to claim 10, wherein transistors are all of NPN-type and the diodes are formed of NPN-type transistors whose base and collector are connected in common.

13. A master-slave-type J·K flip-flop circuit formed of an integrated circuit having current-switching-type logic circuits, said circuit (FIG. 4) including:

a master section comprising:

a power source;

a first current-switching-type logic circuit including a 206 switch transistor and AND-input gate;

a second current-switching-type logic circuit including a 215 switch transistor and an AND-input gate;

a flip-flop circuit element including 220 and 222 gating transistors which form parts of first and second OR gates, respectively, and having first and second outputs;

means for directly connecting together the collectors of said 206 and 220 transistors; and means for directly connecting together the collectors of said 215 and 222 transistors to directly interconnect the AND gates of said first and second current-switching circuits to said flip-flop circuit element, whereby the outputs of the first and second current-switching-type logic circuits cause said flip-flop circuit element of said master section to operate; and a slave section comprising:

a power source;

a first current-switching-type logic circuit including a 303 switch transistor and an AND-input gate;

a second current-switching-type logic circuit including a 308 switch transistor and an AND-input gate;

means coupling said inputs of said master section flip-flop element to drive said 303 and 308 transistors;

a flip-flop circuit element including 311 and 312 gating transistors which form parts of first and second OR gates, respectively, and having third and fourth outputs;

means for directly connecting together the collectors of said 303 and 311 transistors;

means for directly connecting together the collectors of said 308 and 312 transistors; and a bias circuit supplying threshold voltage to said circuits and circuit elements;

whereby the outputs of said first and second current-switching-type logic circuits of said slave section cause said flip-flop element of said slave section to operate;

said flip-flop circuit elements of said slave and master sections including:

a third-current-switching type logic circuit including:

said gating transistor of said first OR gate having a collector connected to a first resistor, an emitter connected to the power source through a ninth resistor;

a ninth transistor performing an OR operation with the gating transistor and having an emitter and a collector connected in common with those of the gating transistor and a base supplied with a direct set signal;

a 10th transistor carrying out a current-switching operation jointly with said gating or ninth transistor and having a collector connected to ground, an emitter connected to the emitters of said gating and ninth transistors and a base supplied with a threshold voltage from the bias circuit; and an 11th transistor connected as an emitter follower and deriving a NOT-output signal from its emitter, said 11th transistor having a collector connected to ground, an emitter connected to the power source through a 10th resistor and a base connected to the collectors of said gating and ninth transistors and to ground through a first diode connected in parallel with a first resistor; and a fourth current switching type logic circuit including:

said gating transistor of said second OR gate having a collector connected to a third resistor, an emitter connected to the power source through an 11th resistor and a base supplied with the NOT output from the emitter of said 11th transistor;

a 12th transistor performing an OR operation with the gating transistor and having an emitter and collector connected in common with those of the gating transistor and a base supplied with a direct reset signal;

a 13th transistor carrying out a current-switching operation jointly with said gating or 12th transistor and having a collector connected to ground, an emitter connected to the emitters of the gating and 12th transistors and a base supplied with a threshold voltage from the bias circuit; and a 14th transistor connected as an emitter follower and deriving an output signal from its emitter, said 14th transistor having a collector connected to ground, an emitter supplying outputs to the base of said gating transistor and connected to the power source through a 12th resistor, and a base connected to the collectors of the gating and 12th transistors and to ground through a second diode connected in parallel with a third resistor.

14. A master-slave-type J·K flip-flop circuit according to claim 13 wherein, in each of said slave and master sections, said bias circuit includes:

a 15th transistor having a collector to the ground and an emitter connected to the power source through a 16th resistor, the threshold voltage being derived from between the emitter of the 15th transistor and the 16th resistor and being supplied to the base of said 10th transistor of the third current-switching logic circuit and to the base of said 13th transistor of the fourth current-switching logic circuit;

a 17th resistor connected between the collector and the base of said 15th transistor; and a third diode, the anode thereof being coupled to the base of said 15th transistor and the cathode thereof being coupled to the power source through an 18th resistor.

15. A master-slave-type J·K flip-flop circuit formed of an integrated circuit having current-switching-type logic circuits, said circuit (FIG. 4) including:

a master section comprising:

a power source;

a first current-switching-type logic circuit including a 206 switch transistor and an AND-input gate;

a second current-switching-type logic circuit including a 215 switch transistor and an AND-input gate;

a flip-flop circuit element including 220 and 222 gating transistors which form parts of first and second OR gates, respectively, and having first and second outputs;

means for directly connecting together the collectors of said 206 and 220 transistors; and means for directly connecting together the collectors of said 215 and 222 transistors to directly interconnect the AND gates of said first and second current switching circuits to said flip-flop circuit element, whereby the outputs of the first and second current-switching-type logic circuits cause said flip-flop circuit element of said master section to operate; and a slave section comprising:

a power source;

a first current-switching-type logic circuit including a 303 switch transistor and an AND input gate;

a second current-switching-type logic circuit including a 308 switch transistor and an AND-input gate;

means coupling said inputs of said master section flip-flop element to drive said 303 and 308 transistors;

a flip-flop circuit element including 311 and 312 gating transistors which form parts of first and second OR gates, respectively, and having third and fourth outputs;

means for directly connecting together the collectors of said 303 and 311 transistors; means for directly connecting together the collectors of said 308 and 312 transistors; and a bias circuit supplying a threshold voltage to said circuits and circuit elements;

whereby the outputs of said first and second current-switching-type logic circuits of said slave section cause said flip-flop element of said slave section to operate;

said flip-flop circuit elements of said slave and master sections including:

a fifth current-switching-type logic circuit including:

said gating transistor of said first OR gate having a collector connected to ground through a first resistor, and an emitter connected to the power source through 13th and 15th resistors;

a ninth transistor performing an OR operation with the first gating transistor having a collector connected in common with that of the gating transistor, an emitter connected to the power source through the 15th resistor in parallel with the gating transistor and the 13th resistor, and a base supplied with the direct set signal; and an 11th transistor for deriving a NOT-output signal from its emitter and having a collector connected to ground, a base connected to the collectors of the gating and ninth transistors and to ground through a first diode connected in parallel with a first resistor, and an emitter connected to the power source through a tenth resistor; and a sixth current-switching-type logic circuit including:

said gating transistor of said second OR gate having a base supplied with the NOT output from the emitter of the 11th transistor, a collector connected to ground through a third resistor, and an emitter connected to the power source through a 14th and said 15th resistors;

a 12th transistor performing an OR operation with the second gating transistor and having a collector connected in common with that of the gating transistor, an emitter connected to the power source through the 15th resistor in parallel with gating transistor and the 14th resistor, and a base supplied with the direct reset signal; and a 14th transistor for deriving output signal from its emitter and for carrying out a current-switching operation jointly with said first gating transistor, said 14th transistor having a collector connected to ground, a base connected to the collectors of the second gating and 12th transistors and to ground through a second diode connected in parallel with a third resistor, and an emitter connected to the power source through a 12th resistor and to the base of said first gating transistor.

16. A master-slave-type J·K flip-flop circuit formed of an integrated circuit having current-switching-type logic circuits, said circuit (FIG. 4) including:

a master section comprising:

a power source;

a first current-switching-type logic circuit including a 206 switch transistor and an AND-input gate;

a second current-switching-type logic circuit including a 215 switch transistor and an AND-input gate;

a flip-flop circuit element including 220 and 222 gating transistors which form parts of first and second OR gates, respectively, and having first and second outputs;

means for directly connecting together the collectors of said 206 and 220 transistors; and means for directly connecting together the collectors of said 215 and 222 transistors to directly interconnect the AND gates of said first and second current-switching logic circuits to said flip-flop circuit element, whereby the outputs of the first and second current-switching-type logic circuits cause said flip-flop circuit element of said master section to operate; and a slave section comprising:

a power source;

a first current-switching-type logic circuit including a 303 switch transistor and an AND-input gate;

a second current-switching-type logic circuit including a 308 switch transistor and an AND-input gate;

means coupling said inputs of said master section flip-flop element to drive said 303 and 308 transistors;

a flip-flop circuit element including 311 and 312 gating transistors which form parts of first and second OR gates, respectively, and having third and fourth outputs;

means for directly connecting together the collectors of said 303 and 311 transistors;

means for directly connecting together the collectors of said 308 and 312 transistors; and a bias circuit supplying a threshold voltage to said circuits and circuit elements;

whereby the outputs of said first and second current-switching-type logic circuits of said slave section cause said flip-flop element of said slave section to operate;

said first current-switching-type logic circuit of each of said master and slave section comprising:

a first group of transistors having their bases supplied with set signals and their collectors grounded;

a second transistor having its collector grounded via a first resistor, a base to which said threshold voltage is supplied from said bias circuit, and na emitter which is connected to the emitters of said first group of transistors in common and to the power source through a second resistor; and wherein the second current-switching-type logic circuit of each of said master and slave sections comprises:

a third group of transistors having their bases supplied with reset signals and their collectors grounded; and a fourth transistor having its collector grounded through a third resistor, a base supplied with said threshold voltage from said bias circuit, and an emitter which is connected to the emitters of said third group of transistors in common and to the power source through a fourth resistor;

all of said transistors being of the NPN-type and said diodes being formed of NPN-type transistors whose base and collector are connected in common.

* * * * *